US011515433B2

(12) United States Patent
Harnett (10) Patent No.: US 11,515,433 B2
(45) Date of Patent: Nov. 29, 2022

(54) SEMICONDUCTING MATERIALS WITH SURROUNDING RADIAL P-N DIODES

(71) Applicant: UNIVERSITY OF LOUISVILLE RESEARCH FOUNDATION, INC., Louisville, KY (US)

(72) Inventor: Cindy Harnett, Louisville, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 62 days.

(21) Appl. No.: 16/960,407

(22) PCT Filed: Jan. 8, 2019

(86) PCT No.: PCT/US2019/012598
§ 371 (c)(1),
(2) Date: Jul. 7, 2020

(87) PCT Pub. No.: WO2019/139862
PCT Pub. Date: Jul. 18, 2019

(65) Prior Publication Data
US 2020/0335638 A1    Oct. 22, 2020

Related U.S. Application Data

(60) Provisional application No. 62/615,158, filed on Jan. 9, 2018.

(51) Int. Cl.
| | | |
|---|---|---|
| *H01L 29/861* | (2006.01) | |
| *D03D 1/00* | (2006.01) | |
| *H01L 29/06* | (2006.01) | |
| *H01L 29/66* | (2006.01) | |
| *D03D 15/47* | (2021.01) | |

(52) U.S. Cl.
CPC ......... *H01L 29/861* (2013.01); *D03D 1/0088* (2013.01); *D03D 15/47* (2021.01); *H01L 29/0657* (2013.01); *H01L 29/66136* (2013.01)

(58) Field of Classification Search
CPC ............... H01L 29/861; H01L 29/0657; H01L 29/66136; H01L 29/16; H01L 25/0753; H01L 33/16; H01L 2924/12036; H01L 2924/12031; H01L 29/868; D03D 1/0088; D03D 15/47; D10B 2101/20; D10B 2401/16
See application file for complete search history.

(56) References Cited

U.S. PATENT DOCUMENTS

| | | | |
|---|---|---|---|
| 6,490,402 B1 * | 12/2002 | Ota | D02G 3/441 257/E25.02 |
| 2008/0081528 A1 | 4/2008 | Carter et al. | |
| 2008/0317408 A1 * | 12/2008 | Verschueren | D02G 3/441 385/41 |
| 2010/0135622 A1 | 6/2010 | Sasho et al. | |

(Continued)

FOREIGN PATENT DOCUMENTS

WO    WO-2012061919 A1 *   5/2012   ............. H01M 4/68

*Primary Examiner* — Shahed Ahmed
(74) *Attorney, Agent, or Firm* — WCF IP (57) ABSTRACT

A flexible wire comprises a conductive core surrounded by one or more radial p-n diodes and alternating conductive and non-conductive bands along an outermost surface. Methods for producing the wire are also disclosed, as are textiles and other flexible materials comprising or consisting of such flexible wires.

16 Claims, 11 Drawing Sheets

(56) References Cited

U.S. PATENT DOCUMENTS

| | | |
|---|---|---|
| 2011/0133932 A1 | 6/2011 | Tan et al. |
| 2013/0224579 A1 | 8/2013 | Berrang et al. |
| 2013/0328062 A1 | 12/2013 | Hisamoto et al. |
| 2014/0065847 A1 | 3/2014 | Sagalio et al. |
| 2014/0367638 A1 | 12/2014 | Herner |
| 2016/0351292 A1 | 12/2016 | Toth et al. |

* cited by examiner

SEMICONDUCTING MATERIALS WITH SURROUNDING RADIAL P-N DIODES

CROSS-REFERENCE TO RELATED APPLICATIONS

This application claims the benefit of U.S. provisional patent application No. 62/615,158, filed Jan. 9, 2018, the complete contents of which are herein incorporated by reference.

FIELD OF THE INVENTION

The pertinent field is generally soft electronics and flexible circuits and components thereof, as well as methods for fabricating the same.

BACKGROUND

In the fabrication of semiconducting materials, past techniques have included forming silicon electronic devices deposited on single-crystal silicon wafers using thin-film deposition techniques. In one variation on this method, silicon is deposited on a glass ("oxide") layer atop a silicon wafer, or the silicon is deposited on a slab of quartz glass. Because the film deposition is performed at temperatures of up to 1100° C., the surface (i.e., "substrate") being coated with silicon must be compatible with high temperatures. Quartz and silicon are acceptable choices. While these substrates have many practical uses in electronics, they are generally brittle and breakable. As the technology progressed, thin films were transferred onto other surfaces, producing functional semiconductor devices on flexible plastic and even stretchable rubber surfaces, opening the possibility of direct skin contact for health monitoring. However, improved approaches are still needed for thin-film-on-flexible-substrate to advance into the area of continuous fibers used for wiring and sewing, or for use in fiber-based tapes and wearable electronic sensors.

Figure 10A:
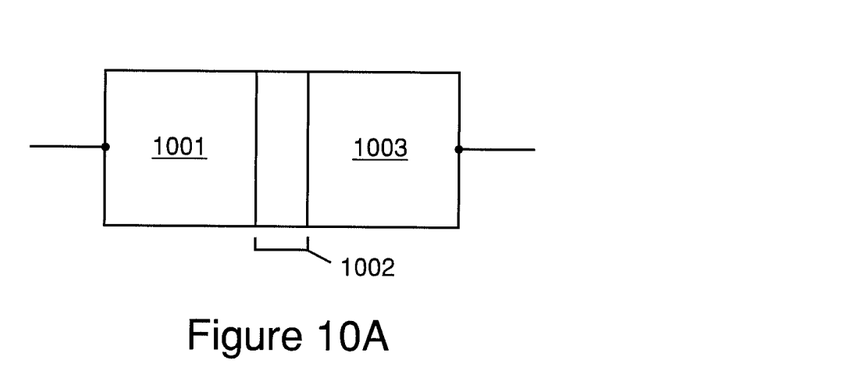
FIG. 10A is a p-n junction diode representation.
Figure 10B:
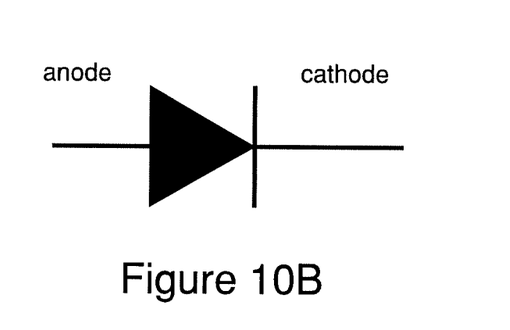
FIG. 10B is a schematic symbol of a diode.
Figure 10C:
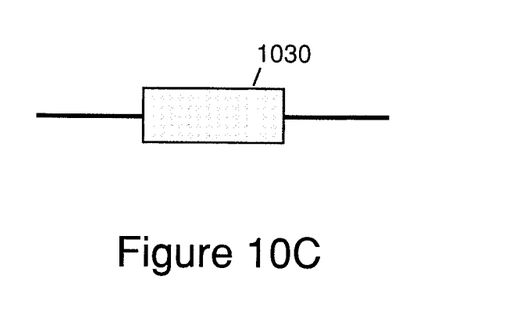
FIG. 10C is the actual appearance of a conventional inflexible diode for use in a rigid circuit, e.g., printed circuit board (PCB).

FIG. 10A illustrates a traditional p-n junction diode representation. A p-type material 1001 is separated from an n-type material 1003 by a depletion region 1002. FIG. 10B is the schematic symbol for a diode, with the anode on the left and the cathode on the right. FIG. 10C shows the typical appearance of a diode designed for rigid circuits and circuit boards. The stripe 1030 marks the cathode.

SUMMARY

According to one aspect, some exemplary embodiments include a flexible wire or thread comprising one or more silicide conductive coatings around a durable, heat-resistant conductive or non-conductive inner core. The core, including any coating, is surrounded by one or more radial p-n diodes. By using this configuration, electric current is able to cross into the conductive core from an outside contact, yet the arrangement of the p-n diode restricts the flow of current in a direction radially away from the core, thereby preventing challenges such as reverse-polarity voltages that might damage electronic components. Alternative embodiments may reverse the diode configuration so that the current direction bias is in the opposite radial direction (i.e., away from the core).

According to one aspect, some embodiments may utilize a continuous conductive inner core (coated in some embodiments, uncoated in other embodiments) disposed under silicon and/or other semiconductor materials.

According to one aspect, some embodiment may provide for a diode wire for an electronic circuit for applications such as but not limited to flexible wearable sensors, in which the wire has alternating conducting and non-conducting (i.e., insulating) bands along the length of the wire, with a coating that forms a radial p-n junction surrounding the wire characterizing the conducting bands.

According to one aspect, some exemplary embodiments involve the fabrication and repair of soft electronics and flexible circuits, and include high-temperature compatible fibers as a substrate for semiconductor deposition and device fabrication. In some embodiments, a flexible diode wire or thread is integrated or integratable with an electronic circuit for wearable sensors, and the wire is characterized by alternating conducting and non-conducting bands or regions along the length of the wire. The conducting bands may be formed by adhering a coating to the wire and forming a radial p-n junction surrounding the wire.

With use of anisotropic conductive threads, a number of applications become readily apparent. These include, but are not limited to, connecting microelectromechanical (MEMS) silicon wafers to flexible, stretchy electronic textile systems for sensor-equipped wearable devices; cost-effective connectors that attach more robust and comparatively expensive printed circuit boards such as wireless communication modules to wearable, disposable textile-based sensors; the repair of flexible conductive circuits, assistive wearable devices, or e-textiles after they have torn; and materials for connecting in a single step conductive traces across a seam in e-textile garments that contain sensors and which are assembled from individual pieces. It will be appreciated that the approaches and applications of the technology disclosed herein can be used on garments, textiles, and a wide variety of soft, flexible substrates that move and bend (wearable garments being one example), but for which electrical connections are nonetheless needed and beneficial. The word "substrate" may be used herein to encompass various kinds of articles. One advantage to the present embodiments is that the threads are used mechanically to attach pieces of substrate together, as well as electrically to establish and maintain electrical connections.

Multiple wires may be combined with one another and/or with other wires, filaments, chords, threads, or the like to form two-dimensional or three-dimensional structures such as textiles, which may be woven, braided, interwoven, or some other configuration.

The wires of some embodiments may be elements of circuitry that is realized and/or integrated in two or more dimensions and employed in a method for realizing and/or integrating circuitry in two or more dimensions, wherein the circuitry comprises elements in the form of wires, fibers, ribbons, strips or multicomponent filaments and/or combinations thereof. An exemplary apparatus may contain circuitry comprising elements in the form of wires, fibers, ribbons, strips, or multicomponent filaments and/or combinations thereof, said elements interfacing in a predetermined pattern such that said circuitry are realized with intersections in physical or near physical contact between the elements thereof. The predetermined pattern may be generated by integrating physically two or more of said elements in a fabric-like structure by one or more processes including but not limited to weaving, knitting, crocheting, knotting, stitching and/or combinations thereof. Individual elements may be transparent, non-transparent, conducting, semiconducting, or isolating materials and/or combinations thereof. At least some of said elements according to their material properties form electrical or optical transmission lines or isolators in said circuitry, said electrical or optical transmission lines conveying respectively electrical or optical energy between points and/or areas in said fabric-like structure, that at least some of said elements comprise spatially defined extended active regions, and that at least some of said elements in portions of said fabric-like structure are adapted for emitting or absorbing electrical, chemical, mechanical or optical energy or by interacting with each other by an exchange of energy of the aforementioned kinds.

The use of improved materials and processes coupled with radially surrounding p-n diodes provides a number of advantages over past approaches. Further, many other features and advantages can be realized through the practice of the present embodiments, as explained in greater detail below.

DETAILED DESCRIPTION

Figure 1:
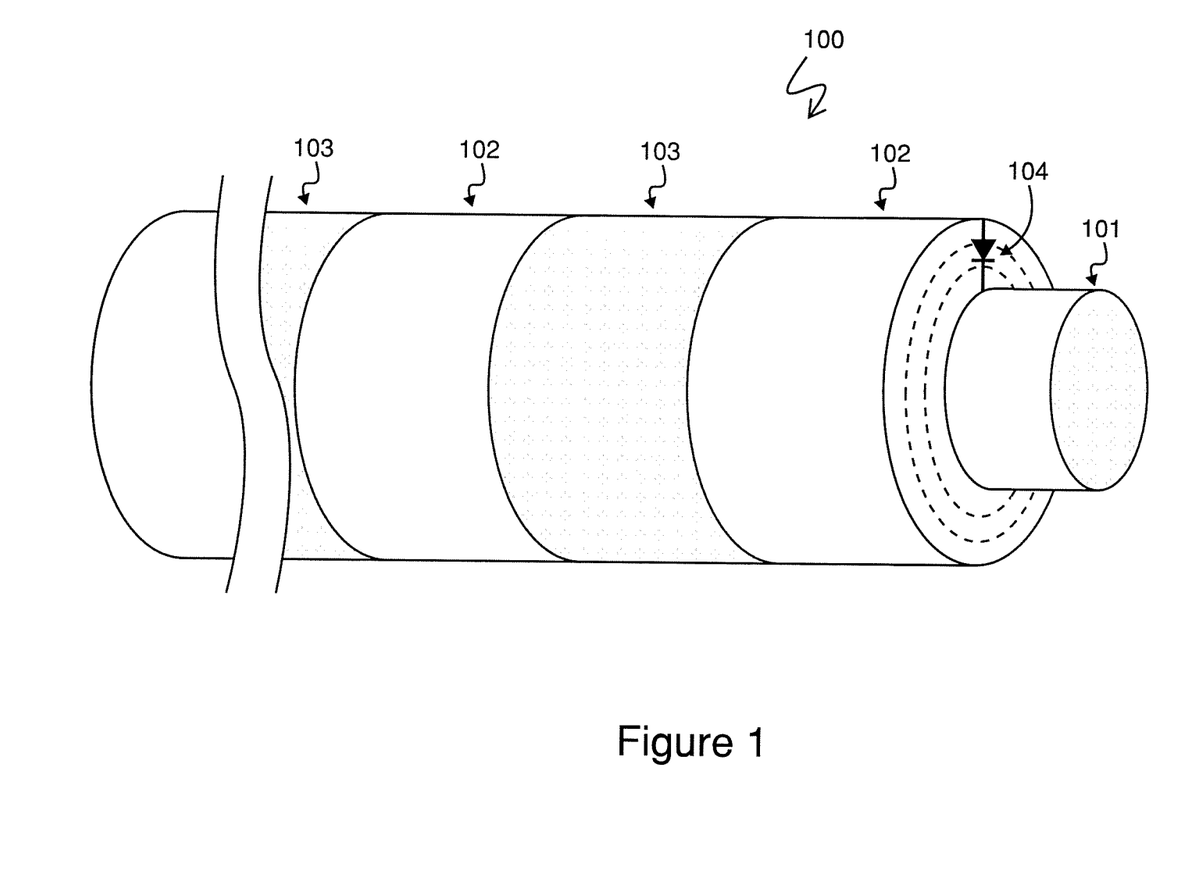
FIG. 1 illustrates a flexible wire with a single fiber core having a conductive coating surrounded by thin-film silicon p-n junction and an ohmic (conductive) contact outer coating, according to multiple embodiments and alternatives. The multi-diode structure is depicted with insulating (dark) and conducting (light) segments, according to multiple embodiments and alternatives.

In accordance with some exemplary embodiments, FIG. 1 shows a semiconductor device, in particular a flexible wire 100, comprising a conductive core 101 surrounded by one or more radial diodes 104 and alternating conductive bands 102 and non-conductive bands 103 along an outermost surface of the flexible wire 100. The flexible semiconductor device is an elongate structure. Elongate may mean, for example, having a length of at least 1 cm, at least 2 cm, at least 3 cm, at least 5 cm, at least 6 cm, at least 7 cm, at least 8 cm, at least 9 cm, at least 10 cm, at least 50 cm, or at least 100 cm. An elongate semiconductor device like flexible wire 100 may be, for example, in the range of 1 to 100 cm. The flexible wire 100 may be a flexible (e.g., ~2 mm bending radius), diode-covered wire with a conductive coating of silicide around a quartz inner core, surrounded by multiple radial p-n diodes. Note that the elements in FIG. 1 are not necessarily to scale with one another. All of the elements are depicted at sufficient size to permit visual differentiation from one another and reproducibility of the image. Exemplary dimensional criteria for respective components are discussed in further detail below.

Flexible (or ultraflexible), as used herein for wires/threads/fibers/yarns/chords/etc., may be defined as having a bending radius of 2 mm or less. Flexible may be, for example, having a bending radius of 0.05 to 2 mm, 0.05 to 0.1 mm, 0.1 to 0.2 mm, 0.2 to 0.3 mm, 0.3 to 0.4 mm, 0.4 to 0.5 mm, 0.5 to 0.6 mm, 0.6 to 0.7 mm, 0.7 to 0.8 mm, 0.8 to 0.9 mm, 0.9 to 1.0 mm, 1.0 to 1.1 mm, 1.1 to 1.2 mm, 1.2 to 1.3 mm, 1.3 to 1.4 mm, 1.4 to 1.5 mm, 1.5 to 1.6 mm, 1.6 to 1.7 mm, 1.7 to 1.8 mm, 1.8 to 1.9 mm, 1.9 to 2.0 mm, or some combination of these ranges.

A radial diode 104, as the name implies, is oriented to pass current in one or more radial directions according to the wire's geometry. Depending on its orientation, a given radial diode may be configured to pass current only in a radial direction toward the wire's core. Alternatively, the radial diode may be configured to pass current only in the radial direction away from the wire's core. As a general matter, a radial diode does not conduct a substantial amount (or any amount) of current along the wire's axial or longitudinal direction. Currents along the axial or longitudinal direction may be conducted by the conductive coating of the core or by the inner core material if the inner core material is inherently conductive.

A wire 100 may be configured with an anode on the outside and a cathode at the inside or core ("outside" and "inside" being assessed along a radial direction). According to the orientation of the diode 104 as depicted schematically in FIG. 1, current may be passed from the outside of a conductive band 102 toward the core 101. For an electric current to cross into the conductive core from an outside contact in a first direction moving radially inward toward the core, one must apply a higher voltage than the internal voltage at the core; in a conventional planar silicon semiconductor device, for example, the outer voltage may need to be ~0.7V higher than the inside for current to flow. Conversely, the p-n diode 104 is configured to restrict the flow of current in a second direction radially away from the core 101. Accordingly the wire 100 is configured to prevent reverse-polarity voltages from damaging electronic components, for example when a battery is plugged in backwards. The diode 104 keeps charges moving from their origination and radially toward the core 101 and not away from the core 101. Conventional planar diodes are already used for such reverse polarity protection but suffer the drawback of increasing the number of components in an electronic design. Present embodiments overcome this drawback by building this rectifying function into a wire, thereby providing reverse polarity protection yet leaving component count unaffected or even reducing the component count of an electronic design.

The number of conductive bands 102 and the number of non-conductive bands 103 may vary from one embodiment to another. In general at least one band 102 and one band 103 is present. Alternating conducting and non-conducting bands 102 and 103 have various benefits such as but not limited to prevent shorting due to proximity with neighboring circuits. The alternating bands 102 and 103 may provide for different conductivity values whereby electrical signals are transmitted through the conducting bands of the wire while the non-conducting bands prevent shorting due to proximity with neighboring circuits. Many neighboring circuits may be expected in a garment with wearable sensing technology, for example. The sizes of individual conductive or non-conductive bands (e.g., length as measured along the axial or longitudinal direction of the wire) may differ even on the same wire. For applications where the wire is expected to contact many different traces and only sample those having a higher voltage than the core, it is necessary to have isolated diodes scattered along the outside of the wire in short (e.g., 1-3 mm) bands. Otherwise, the wire may short the different traces together along its outside surface.

In some embodiments a wire 100 may be characterized by other terms such as but not limited to fiber, ribbon, strip, thread, string, yarn, filament, strand, and chord. Thread is, for example, a type of yarn. For internal consistency and readability, "wire" alone is generally used in this disclosure. It should be appreciated that a "wire" according to its use herein may comprise or consist of, for example, a conductive coating on the surface of a non-conductive fiber. This may contrast with "wire" as often used in certain electronics arts where the word may imply a device consisting of a conductive metal fiber with or without insulative cladding(s). According to some exemplary embodiments, electronic functionality may be embedded throughout woven, knitted, crocheted, knotted and/or stitched structures, with the strands in the structures acting as signal and/or power conduits and creating or promoting structural integrity.

The outermost surface or surfaces of a wire 100 may be opaque or it may be transparent. Many suitable materials for the outermost surface are naturally opaque. Many key advantages of exemplary embodiments are realized by the signal control properties of the configured materials without regard to the optical properties of these materials.

Figure 2A:
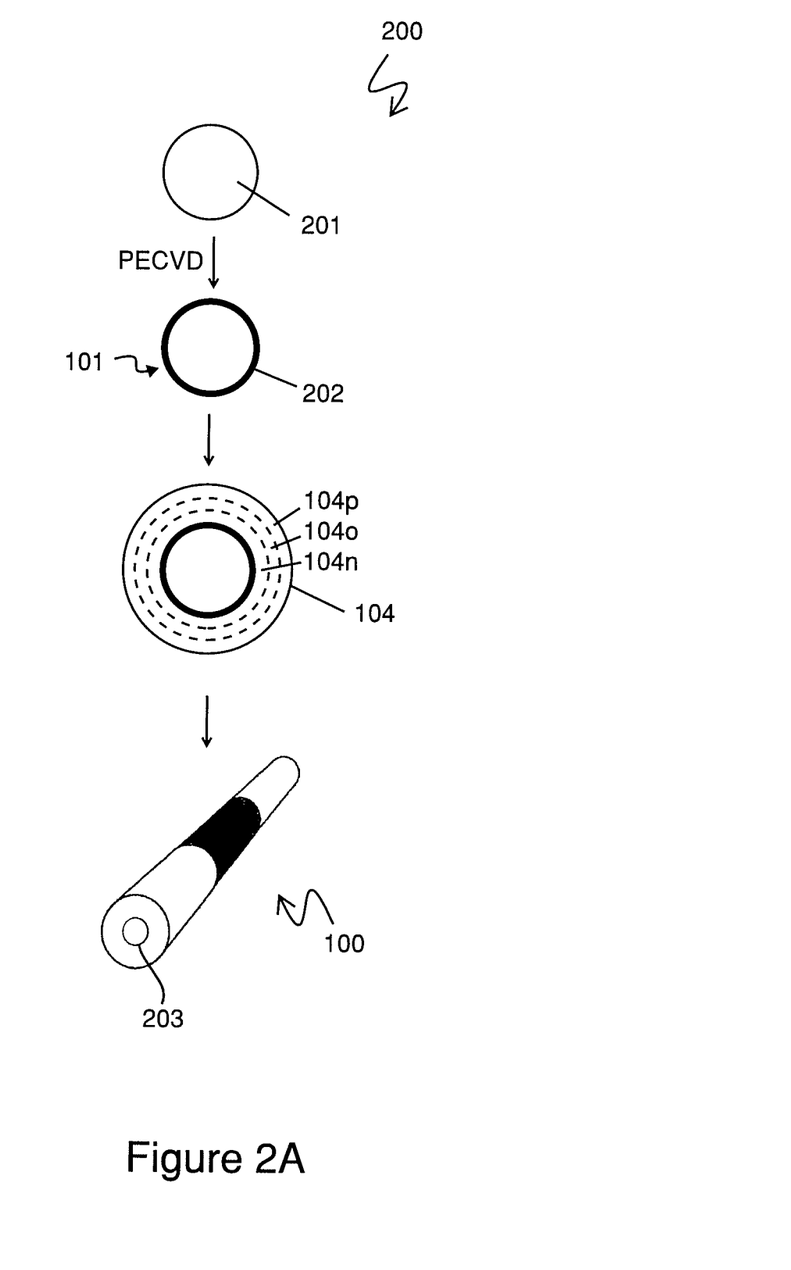
FIG. 2A is a flow diagram of manufacturing steps for producing a flexible wire such as that of FIG. 1.

FIG. 2A is a diagram of an exemplary process 200 by which a wire 100 may be manufactured. The following description of FIG. 2A may refer to specific materials for exemplary purposes, but in some embodiments alternative materials or process steps may be employed.

Process 200 may make use of quartz yarn 201 as a starting material. Quartz is advantageous in that it can reach a temperature of 1000° C. without melting yet it is flexible and strong when configured as a yarn. The diameter of quartz yarn 201 may be about 0.5 mm (e.g., 0.1 to 1.0 mm, 0.2 to 0.8 mm, 0.4 to 0.6 mm, or 0.3 to 0.7 mm) or other diameters suitable to work as bobbin thread in an ordinary sewing machine (between 0.05 mm and 1 mm diameter). In general, the core material of a wire 100 should comprise a fiber and/or coating that produces high electrical conductivity along the core, yet of a character that will not be damaged through the temperature and other conditions associated with later processing. Likewise, the core material is selected to not disrupt the outer semiconductor layers' electronic rectifying properties by doping them with metal ions, as inadvertent doping can occur if the structure is heated enough to cause diffusion or alloying at the interface between the metal and semiconductor. Besides quartz, other suitable materials for the core include thin metal fibers such as multi-strand tungsten wire. Depending on the processing conditions, glass fibers exhibit sufficient flexibility for use as core materials and are suitable at temperatures up to about 800° C. Other suitable options include natural fibers such as linen and Nomex® synthetic polymer fiber, to name some examples. These can receive thin coatings of the present embodiments applied through PECVD at temperatures up to about 200° C. The coatings and films should be applied at a deposition temperature compatible with the material used in the core.

To the outside of the yarns or fibers 201 is applied a thin (e.g., 50-300 nm) polysilicon coating 202 using plasma-enhanced chemical vapor deposition (PECVD). Alternatively, application of the coating 202 may be made with low pressure chemical vapor depositions to produce films with higher electron mobility. Because flexibility is inversely proportional to thickness, coating thicknesses in the 50-300 nm range is preferred in many embodiments. The conductive coatings or films disclosed herein are implemented as silicides, an example being a metal such as Ni or Ti deposited on a silicon layer and then annealed. Accordingly conductive coating 202 may include two or more different materials. In embodiments which employ a naturally conductive inner core material for yarn 201, a conductive coating 202 may be omitted.

An advantage of conductors such as silicides for coating 202 is their compatibility with high-temperature processing steps associated with forming soft circuits for a variety of applications. Without limitation, other silicon-metal alloys useful as silicides for various embodiments include $WSi_2$, $TiSi_2$, $MoSi_2$, and $TaSi_2$. $NiSi_2$ is another option if processing temperatures are at about 700° C. or lower. An indium tin oxide conductor commercially used in thin-film transistor (TFT) displays also is suitable for some embodiments.

On the other hand, low-temperature PECVD-deposited semiconducting films and spun-on organic semiconducting films like P3HT (Poly(3-hexylthiophene)), pentacene or other semiconducting polymers are usable in some embodiment in part because of their reduced thermal energy during deposition, making it feasible to use thin metal films of silver, gold, aluminum, copper and chromium, and conducting polymers such as PEDOT (applied either as a liquid such as by inkjet, or vapor deposited) for the conductive coating 202, which are materials that would be damaged during LPCVD polysilicon deposition performed at higher temperatures. Accordingly, there is a relationship between the deposition temperature required for applying the semiconductor and the kinds of materials that are selected. Because P3HT and other semiconducting polymers are sensitive to water, they may not be preferred for applications in high humidity environments. Surface coatings such as silicone, enamel, parylene, or thermoplastic coatings can be applied to protect the organic semiconductor. Coatings will thicken the yarn, and if the coating is damaged, the organic semiconductor will fail. Despite their higher processing cost, inorganic semiconductor films may be preferable in applications that require thin thread, high humidity environments, or high temperature operation.

Figure 2B:
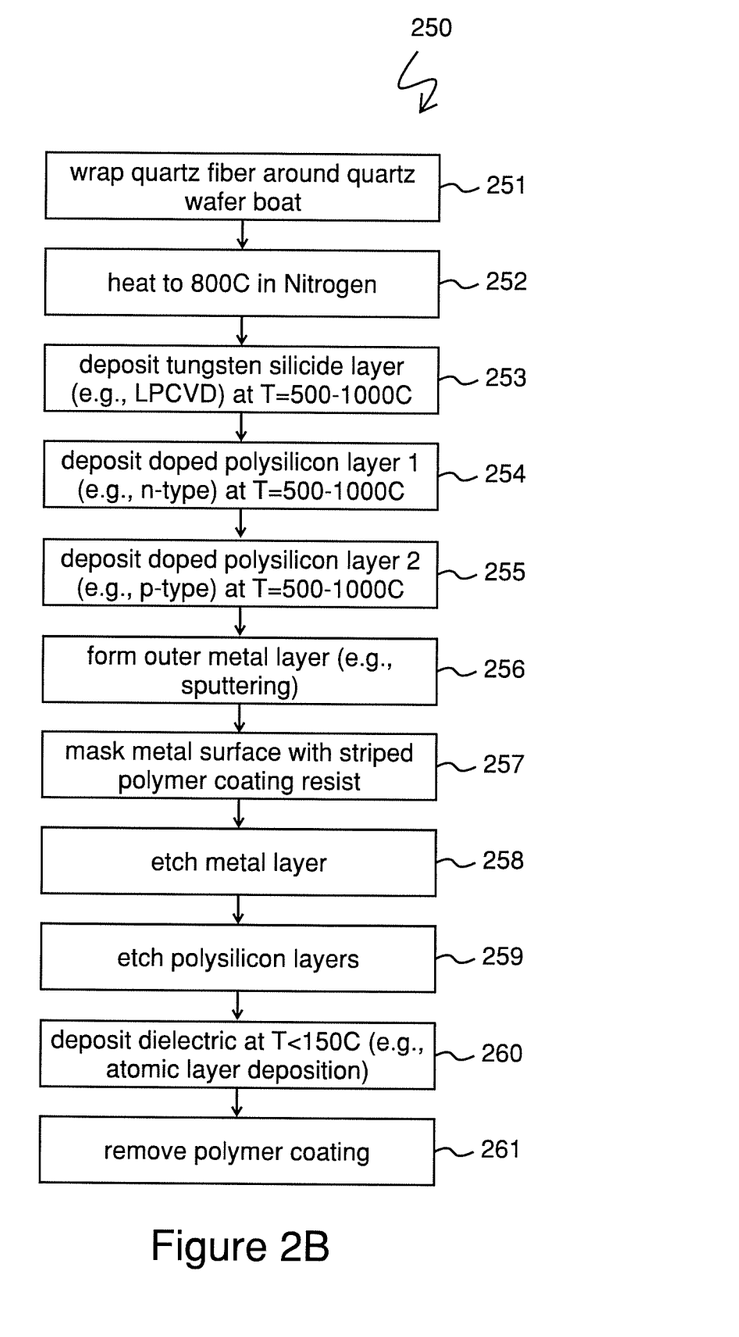
FIG. 2B is another flow diagram of exemplary manufacturing steps.
Figure 3A:
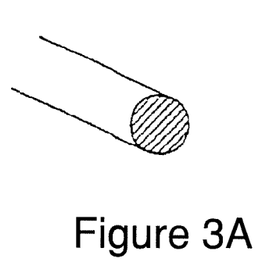
FIGS. 3A to 3E show alternative configurations for a core and/or wire comprising a core, including different cross-sectional geometries and single versus multithreaded embodiments.
Figure 3B:
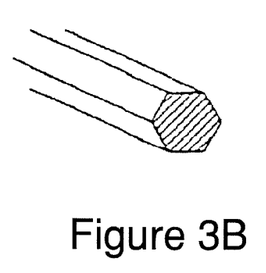
Figure 3C:
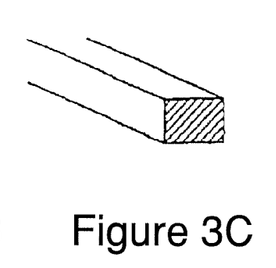
Figure 3D:
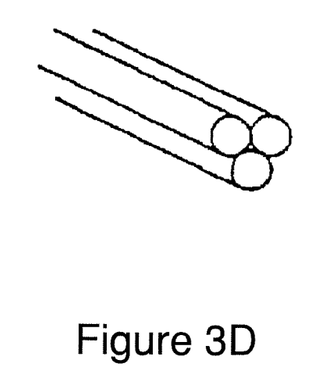
Figure 3E:
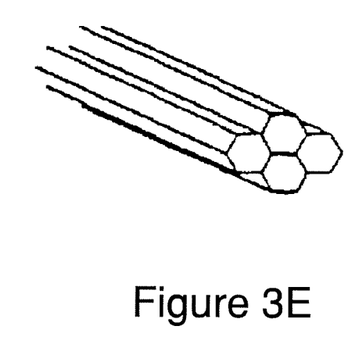
Figure 4A:
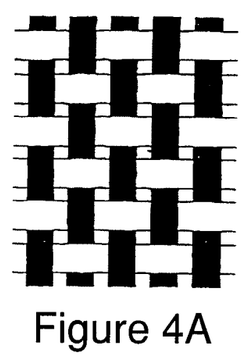
FIGS. 4A to 4E show alternative weave patterns.
Figure 4B:
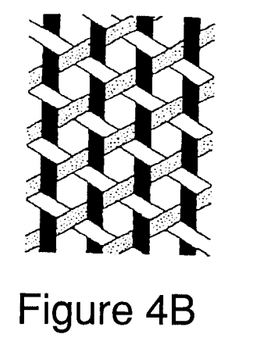
Figure 4C:
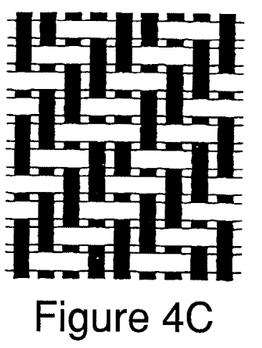
Figure 4D:
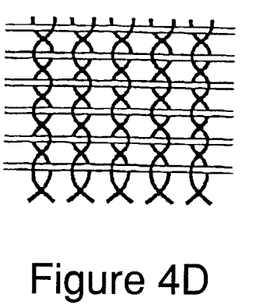
Figure 4E:
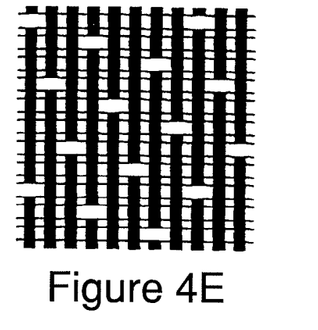

One or more radial diodes 104 are applied surrounding the core 101. A radial diode may be, for example, a single p-n junction or multiple p-n junctions. In FIGS. 1 and 2 broken lines are used to illustrate the presence of multiple layers or materials in the diode 104, although exact internal configuration of the diode layer may vary among embodiments. An exemplary diode may comprise one or more semiconductor materials such as silicon (doped and/or undoped), germanium, selenium, and gallium arsenide. A p-n diode (i.e., a p-n junction diode) may generally comprise an n-type semiconductor 104n, a p-type semiconductor 104p, and a depletion region 104o. The p-n junction should have at least $10^{19}$ dopant atoms per cubic cm (in both the p and n-regions) for reliable electrical contact to the inner and outer electrodes.

FIG. 2B and the following description characterize an exemplary manufacturing process 250 with more specificity for further illustration. For example, in the first step 251, a quartz fiber is wrapped around a quartz wafer boat and heated (step 252) to 800° C. in a nitrogen atmosphere to remove organic contaminants. At step 253, a 50 nm thick tungsten silicide layer is applied conformally using low pressure chemical vapor deposition (LPCVD). At step 254, an 80 nm thick n-type polysilicon layer doped with $10^{19}$ phosphorus atoms/cm$^3$ is deposited using LPCVD, followed by an 80 nm thick p-type polysilicon layer doped with $10^{19}$ boron atoms/cm$^3$ at step 255; all LPCVD steps take place at temperatures between 500 and 1000 C (e.g., 500° C. or above, 600° C. or above, 700° C. or above, 800° C. or above, 900° C. or above, or 1000° C.±tolerance of, e.g., 100° C. or less). At step 256, an outer metal layer with total metal thickness of 50 microns is then formed by sputtering an aluminum adhesion layer followed by a corrosion-resistant gold layer for the external contact.

Radial diodes 104 may be applied to selective sections of a wire 100. Alternatively, the materials forming the diode 104 may be applied unselectively and then selective sections removed. FIG. 2B presents the latter approach.

Nonconductive bands are formed by first masking the metal surface with a striped polymer coating (step 257). The polymer coating can be a photoresist designed to mask wet chemical etchants. However, the polymer need not be photosensitive. 2- to 5-millimeter wide resist stripes are drawn on the spool with a felt-tip brush dispenser containing the resist. The soft felt tip makes sufficient contact with the thread to put resist completely around the circumference. Then, at step 258, the underlying metal is etched in a gold etchant (potassium iodide) followed by an aluminum etchant (Transene Aluminum Etchant Type A: 80 wt % phosphoric acid, 5% nitric acid, 5% acetic acid, and 10% distilled water). At step 259, underlying silicon is removed using xenon difluoride vapor etching, stopping at the silicide layer, which remains continuous. To ensure that the silicide can only be contacted through the radial diodes, a 100 nm thick conformal dielectric ($Al_2O_3$) is deposited at sub-150 C temperatures using atomic layer deposition at step 260. The polymer coating is then removed at step 261 in n-methylpyrrolidone (NMP) solvent to lift off the resist, removing the $Al_2O_3$ from the un-etched gold surfaces and exposing them as contacts. After etching, the wire does not maintain a uniform diameter, but relative to the 50- to 1000-micron diameter core, the variation in diameter is small.

An exemplary manufacturing process according to some embodiments may draw some steps from the processes disclosed in international application PCT/US2017/57964, filed Oct. 24, 2017, and titled "Anisotropic conductive threads for electrical connections in soft electronics," the contents of which are expressly incorporated herein by reference. FIGS. 3A to 3E are non-limiting examples of cross-sectional shapes and single versus multi-stranded arrangements for cores and wires. The wires, fibers, or ribbons composing the circuits of some embodiments may have cross sections that are round (FIG. 3A), oval, square, hexagonal (FIG. 3B), rectangular (FIG. 3C), polygonal, or any other desired shape provided it permits formation of radial diodes about the core. Cores and/or wires may be single-component (e.g., FIGS. 1, 2, 3A, 3B, 3C) or multi-component (e.g., FIGS. 3D and 3E). The components of multicomponent fibers can be arranged in different ways depending on the needs and applications. For instance a given fiber can be multicomponent in the cross-section and/or along the axis of the fiber, causing it to exhibit spatially varying physical, chemical and/or electrical properties. A conductive core and/or the wire containing the core may be single thread or multi-thread. The single-component fibers and different components in multicomponent fibers may be either electrically conductive, semiconducting, superconductive, insulating, optically conductive or any combination thereof, but are not limited to these. The components can be any sensor or detector material such as those activated by light, heat, chemicals, electric and magnetic fields. Individual fibers, single component or multicomponent may be bundled or braided.

A fabric according to some embodiments may be assembled from bundles or braided fibers, or from more complex filament-like structures such as electrical cables with multiple conductors separated by a dielectric. Fibers of different types and different dimensions can be combined in the fabric. For example, alternating conducting and insulating fibers might be useful in some applications. The crossing of two or more fibers in the fabric are natural loci configured or configurable for device functionality such as memory, switches, sensors, etc. The crossing may be left as such or fused or bonded depending on the desired product.

FIGS. 4A to 4E, 5A to 5H, and 6A to 6D are non-limiting examples of weaving and knitting patterns and combinations thereof which may be employed to generate circuits and devices which then form an electronic or opto-electronic fabric as used in an apparatus according to some embodiments.

Figure 5A:
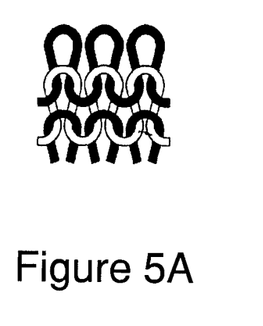
FIGS. 5A to 5H show alternative stitch patterns.
Figure 5B:
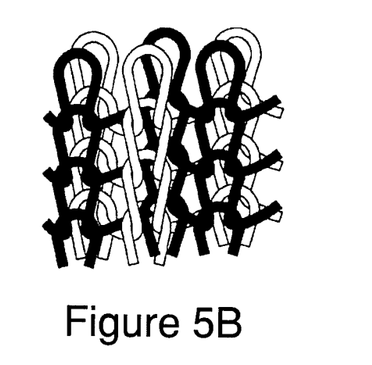
Figure 5C:
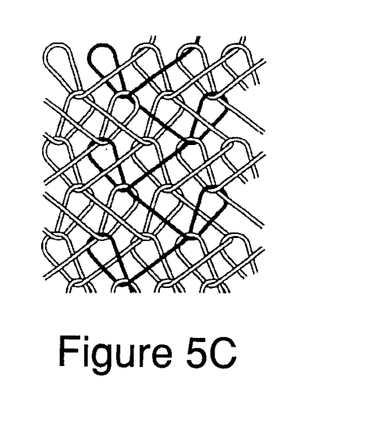
Figure 5D:
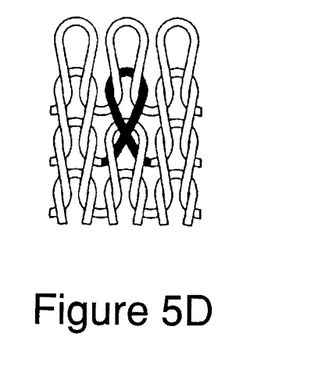
Figure 5E:
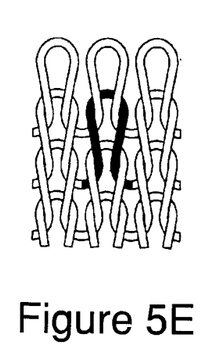
Figure 5F:
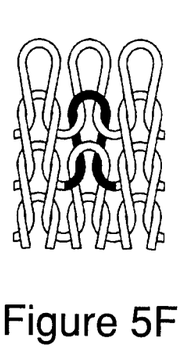
Figure 5G:
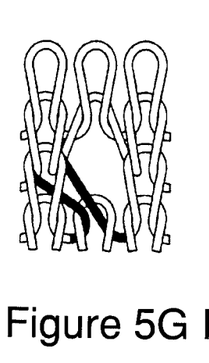
Figure 5H:
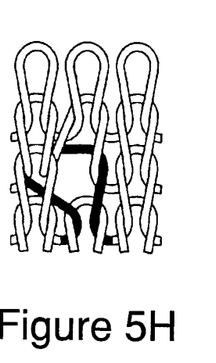
Figure 6A:
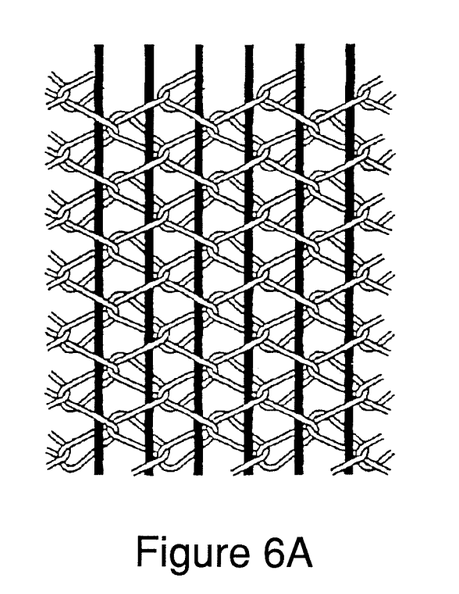
FIGS. 6A to 6D show further alternative patterns.
Figure 6B:
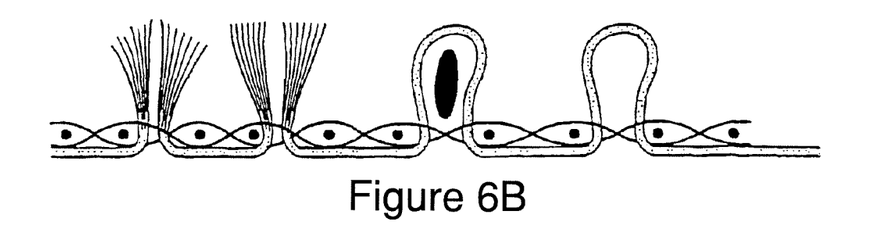
Figure 6C:
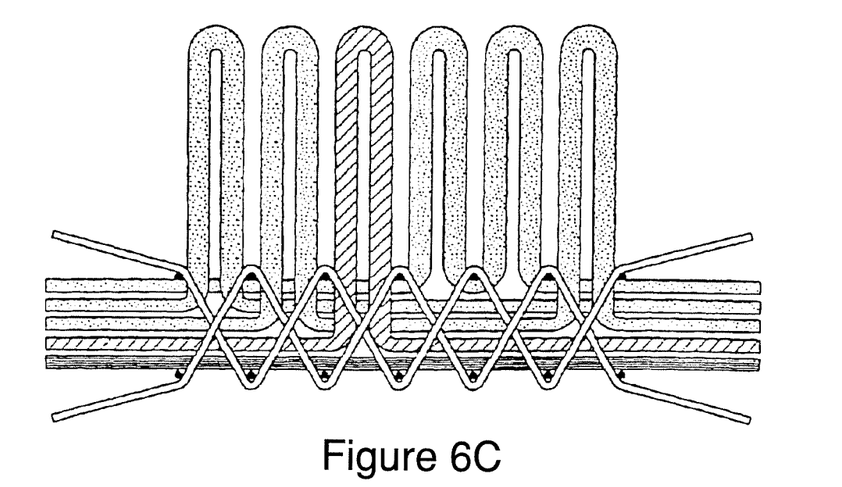
Figure 6D:
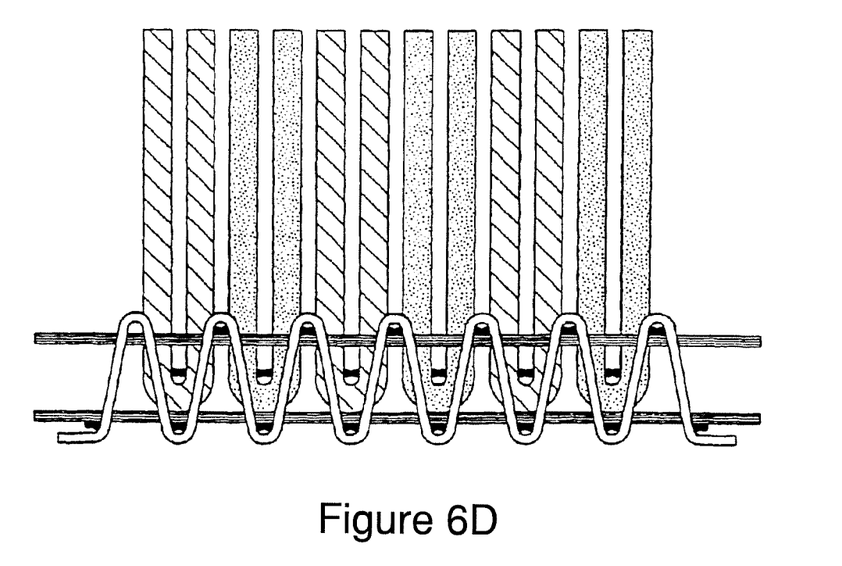

Examples of basic weaves are the plain (FIG. 4A), the triaxial (FIG. 4B), the twill (FIG. 4C), the leno (FIG. 4D) and the satin (FIG. 4E) weaves. Examples of knits are the plain (FIG. 5A), the double (FIG. 5B), and warp (tricot) (FIG. 5C) knits. FIGS. 5D to FH are various weft knit stitches. Examples of multicomponent fabrics include the weft insertion warp knit fabric (FIG. 6A), pile (FIG. 6B), and carpet (FIGS. 6C and 6D) fabrics. Some embodiments may show preference for some of these configurations over others, depending on the intended use and therefore desired characteristics of the fiber. For example, weaves with longer floats (twill for example) may expose more of the fiber for a greater electrical contact area on one side of the fabric. Therefore for an application requiring a comparatively large amount of electrical contact area, twill or other weaves with longer floats may be preferred.

Figure 7:
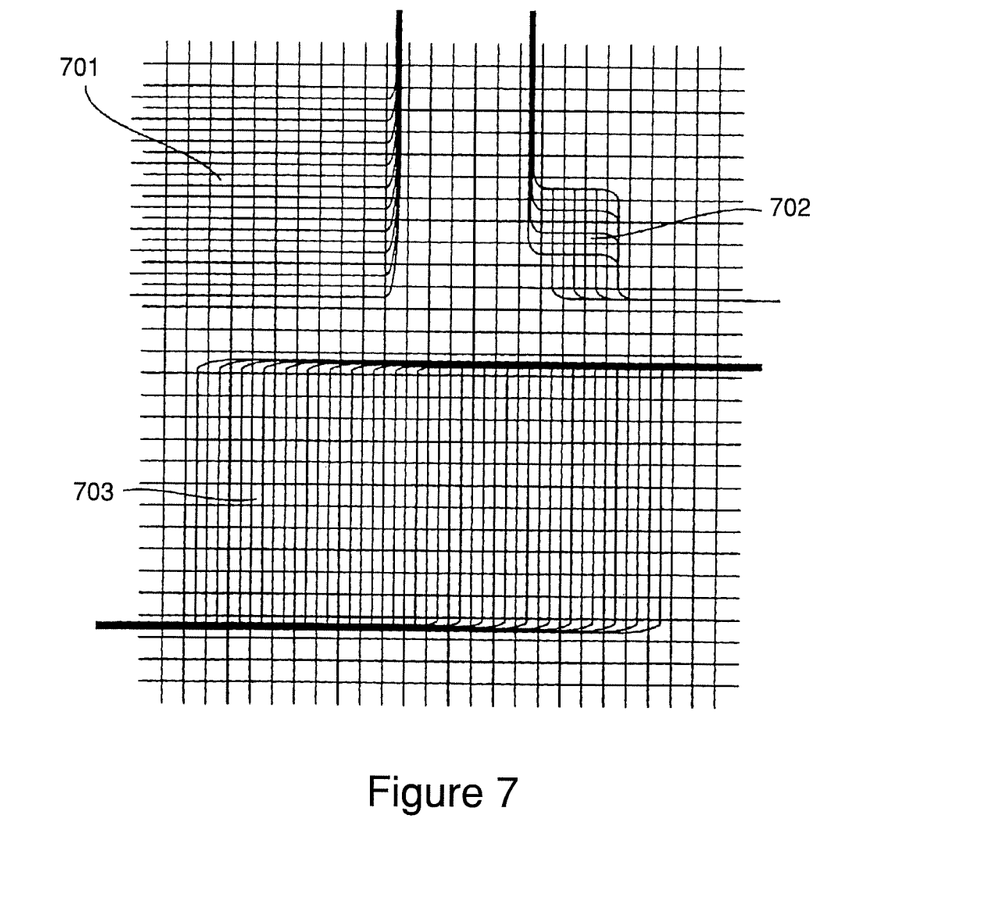
FIG. 7 shows multiple circuits integrated physically but not necessarily electrically within a single textile element.

Functional wires, threads, fabrics, fabric units, and devices can be further combined by being woven or stitched or knitted into a larger fabric as illustrated in FIG. 7. Each of 701, 702, and 703 may be independent circuits integrated with the same single fabric structure. Multilayers knitting is also possible if necessary. An exemplary electronic fabric may be finally impregnated with any substance such as an insulator.

Generally there are no size limitations for embodiments of the invention. Individual devices can be created by weaving a given pattern at a chosen position in the fabric matrix, and the pattern may be of any of many different sizes, customized for different uses. For example the inclusion of a pile of small sensor fibers in a matrix will yield a high surface area detector, therefore high sensitivity. Such devices can be woven, knitted or stitched into the fabric matrix. The circuit or optoelectronics thus fabricated can be addressed from the edges of the fabric or anywhere in the matrix by weaving, knitting, knotting, or stitching in connecting wires.

Figure 8:
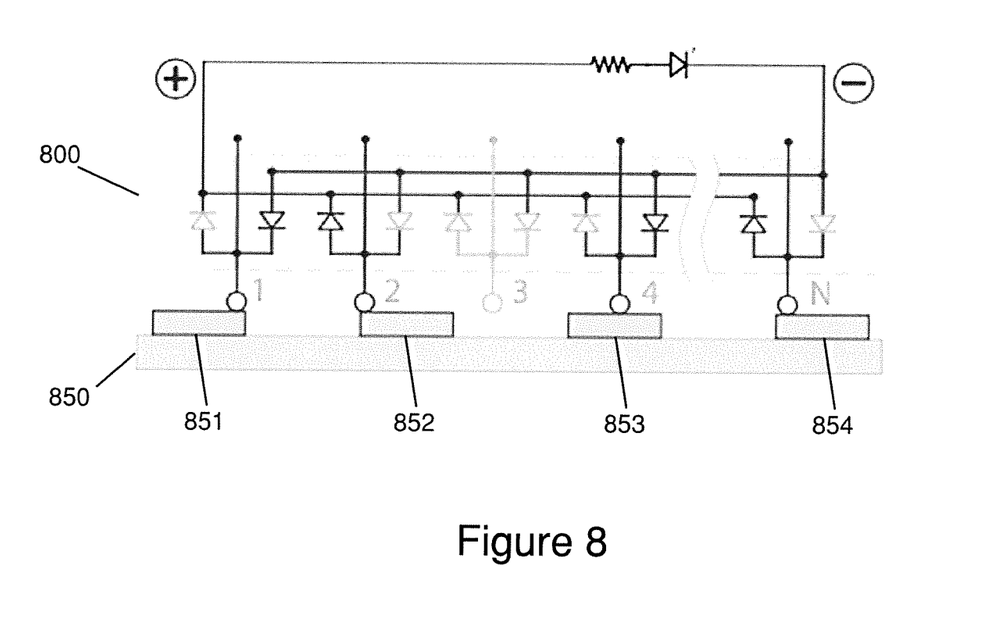
FIG. 8 shows a contact array collecting power from an interdigitated electrode surface.

FIG. 8 diagrammatically shows a smart contact array 800 which consists of or comprises one or more wires such as wire 100 (FIG. 1). The diodes depicted schematically are radial diodes of one or more wires 100. In general, the diodes are preferably intrinsically flexible, and a p-n junction diode covered yarn or thread is one exemplary approach to constructing the smart passive contact array 800 from embroidered or woven fibers, as already discussed above. In view of its constituent materials, the array 800 is flexible (e.g., capable of being bent with a radius of curvature <2 mm) and not rigid. FIG. 8 shows the contact array 800 collecting power from an interdigitated electrode surface 850.

Pairs of (radial) diodes are conductively exposed to an exterior environment of the contact array 800. The two diodes of each pair are oppositely oriented, e.g., one diode has a p-type semiconductor adjacent to the wire's core and the other diode has an n-type semiconductor adjacent to the wire's core. The pair of diodes are positioned or at least exposed electrically to the same or substantially the same location or spot on the outside of the contact array 800. However, each diode of the pair is disposed on a different wire 100 or section of wire 100, as depicted by the schematic of FIG. 8.

A smart contact array 800 is usable in combination with a wide variety of devices which may be temporarily brought into physical and electrical contact with the array 800. FIG. 8 shows an apparatus 850 which has on its exterior a plurality of electrical contacts. As illustrated contacts 851 and 853 have a first polarity, and contacts 852 and 854 have a second polarity opposite the first polarity.

In FIG. 8 each of the contact pin 851, 852, 853, and 854 is electrically connected to two diodes of the contact array 800 and a pass-through.

The diodes produce a rectified power signal and maintained isolation between contacts that touched positive and negative traces on the underlying circuit 850, while the pass-throughs transmit any communication signals originating from the surface. The circuit at each contact may be configured as a standard two-sided diode clipper circuit, except that the clipper limits are provided by the surrounding contacts instead of by power supplies.

Figure 9:
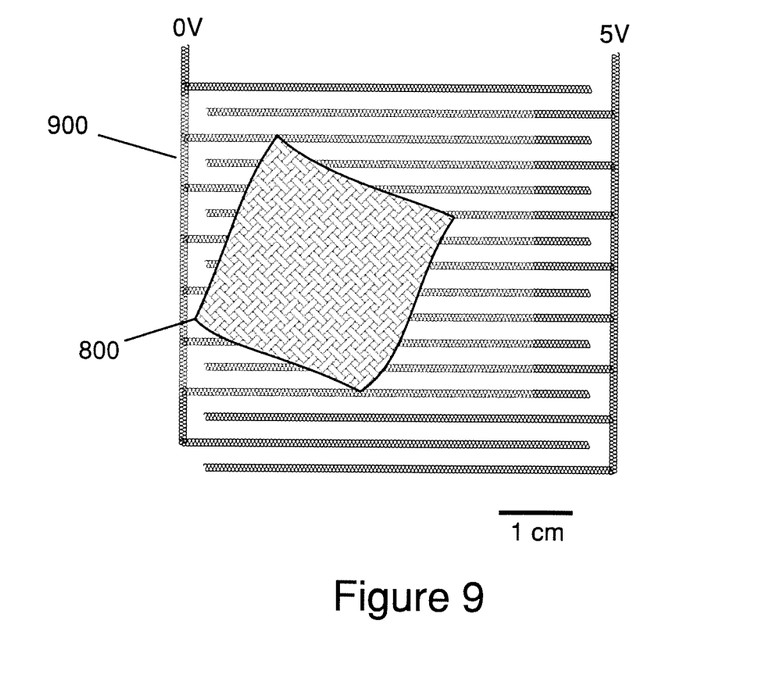
FIG. 9 illustrates interdigitated electrodes with e.g. 2 mm gap and 3 mm width acting as power sources for electronic textile circuits of the kind shown in FIG. 8, according to multiple embodiments and alternatives.

FIG. 9 shows the contact array 800 tapping into an operating electronic textile that carries a power line and ground line sparsely over the circuit area. When the contact array rests across these signal and power lines, it can extract power.

In some embodiments, these passive sheets 800 provide smart materials for room-temperature joining, reworking and repairing electronic circuits printed on plastic films. Other applications which may be adapted from the teachings herein include making non-aligned electrical connections to electronic textile circuits as shown in FIG. 9. The embroidered pattern 900 on an ordinary fabric or garment (e.g., made of conventional textile materials like cotton, nylon, polyester, spandex, wool, silk, etc. or some combination of these) is capable of powering a smart contact array 800 dropped into a pocket as shown in FIG. 9. The smart contact array 800 may be attached or part of a device such as a mobile phone or wearable. In this way power from pattern 900 may be supplied through secure wired connections to sensors embedded in sports medicine wearables and other biomedical wearable sensors.

With the soft circuits 800 depicted in FIGS. 8 and 9, even if the circuit becomes distorted, the contact array may be configured to still draw power from the external circuit 850 or 900 and deliver that power to whatever additional device elements it is connected with.

In some embodiments, the smart contact array 800 is made from a thin material conformable to the surface of a circuit and serves to patch a broken power line, injecting power or signals into a different part of the underlying circuit, or otherwise serving as a contact array patch that can be integrated for repairing circuits. Likewise, in some embodiments, end user-configurable, human-computer interfaces serve as smart home control systems based on a user attaching switches, sliders and small displays to a large-area wallpaper that has electronic traces built in. The smart contact array enables the user to power small devices at any position on the wall, from a variety of orientations.

Certain embodiments provide for a woven or non-woven textile establishing electrical contact when an electrical contact receives signal inputs emanating from the bodily systems of the person wearing it. The contact might be directly in contact with the skin of the wearer, or placed between layers of fabric in which the layer between the contact and the skin is thin enough that it does not greatly interfere with the signals. In some embodiments, the electrical contact comprises a sensor that transmits sensed signals to a microprocessor or other controller in electrical contact with the sensor or in remote communication with the sensor. Through the electrical connections, various kinds of sensing signals produced by the wearer are accessed, transmitted, stored, and used. These may include, but are not limited to, body temperature, heart beat and rate, respiration, dehydration, electromyography sensing, sleep patterns, and biomechanical aspects of physical exertion including the intensity and frequency of pressure applied over a certain body part. Accordingly, some embodiments relate to establishing and maintaining viable electrical connections in a soft garment or other textile environment.

It is to be understood that the embodiments described and/or claimed herein are not limited in their application to the details of the teachings and descriptions set forth herein, or as illustrated in an example. Rather, it will be understood that the embodiments are capable of being practiced or carried out in multiple ways, according to many alternatives based on these descriptions and teachings.

Further, it will be understood that the phraseology and terminology used herein is for the purpose of description and should not be regarded as limiting. The use herein of "including," "comprising," "e.g.," "such as, for example," "containing," or "having" and variations of those words is meant in a non-limiting way to encompass the items listed thereafter, and equivalents of those, as well as additional items. Accordingly, the foregoing descriptions are meant to illustrate a number of embodiments and alternatives, rather than limiting to the precise forms and processes disclosed herein. The descriptions herein are not intended to be exhaustive. It will be understood by those having ordinary skill in the art that modifications and variations of these embodiments are reasonably possible in light of the above teachings and descriptions.

I claim:

1. A method of forming a diode wire, thread, fiber, ribbon, strip, string, yarn, filament, strand, or chord which is integratable with a flexible circuit, comprising:
    coating a non-conductive fiber with a conductor; and
    forming one or more radial p-n junctions over the conductor with alternating conducting and non-conducting bands along an outer surface of the diode wire, thread, fiber, ribbon, strip, string, yarn, filament, strand, or chord.

2. The method of claim 1, wherein the non-conductive fiber is a quartz yarn.

3. The method of claim 2, wherein the conductor is a silicide or doped silicon.

4. The method of claim 3, wherein the coating step is performed in a temperature range of 500 to 1000° C.

5. The method of claim 1, wherein the one or more radial p-n junctions are formed by steps comprising
    depositing first and second doped polysilicon layers atop the conductor at a temperature of 500 to 1000° C., one of the first and second doped polysilicon layers being n-type and the other being p-type;

forming a metal layer atop the polysilicon layers;

masking the metal layer with striped resist;

etching the metal and polysilicon layers where resist is absent;

depositing a dielectric atop an entirety of exposed surfaces; and removing the resist and dielectric atop thereof.

6. The method of claim 1, wherein the non-conductive fiber has a diameter of 0.4 to 0.6 mm.

7. The method of claim 6, wherein the conductor has a thickness of 50-300 nm.

8. The method of claim 1, wherein the non-conductive fiber and conductor together form a core with a diameter of 0.05 to 1 mm.

9. The method of claim 1, wherein the alternating conducting and non-conducting bands are annular.

10. The method of claim 1, wherein the one or more radial p-n junctions are formed by steps comprising applying materials for the radial p-n junctions unselectively atop the conductor, and removing selective sections of the materials for the p-n junctions to form the bands.

11. A method of forming a diode wire, thread, fiber, ribbon, strip, string, yarn, filament, strand, or chord which is integratable with a flexible circuit, comprising:

forming one or more radial p-n junctions over a conductive core with alternating conducting and non-conducting bands along an outer surface of the diode wire, thread, fiber, ribbon, strip, string, yarn, filament, strand, or chord.

12. The method of claim 11, wherein the one or more radial p-n junctions are formed by steps comprising applying materials for the radial p-n junctions unselectively atop the conductive core, and removing selective sections of the materials for the p-n junctions to form the bands.

13. The method of claim 11, wherein the one or more radial p-n junctions are formed by applying materials for the p-n junctions selectively atop selective sections of the conductive core.

14. The method of claim 11, wherein the conductive core is single threaded or multithreaded.

15. The method of claim 14, further comprising coating a non-conductive fiber with a conductor to make the conductive core.

16. The method of claim 11, wherein the one or more radial p-n junctions are formed by steps comprising depositing first and second doped polysilicon layers, one of the first and second doped polysilicon layers being n-type and the other being p-type;

forming a metal layer atop the first and second polysilicon layers;

masking the metal layer with striped resist;

etching the metal and first and second polysilicon layers where resist is absent;

depositing a dielectric atop an entirety of exposed surfaces; and removing the resist and dielectric atop thereof.

\* \* \* \* \*